United States Patent

[11] 3,582,677

[72] Inventor Carroll R. Perkins
Balboa Island, Calif.
[21] Appl. No. 885,515
[22] Filed Dec. 16, 1969
[45] Patented June 1, 1971
[73] Assignee Hughes Aircraft Company
Culver City, Calif.

[54] PULSE SPACING DISCRIMINATOR CIRCUIT

7 Claims, 6 Drawing Figs.

[52] U.S. Cl. .......... 307/234, 307/266, 307/279, 307/293, 307/304, 328/111, 328/120
[51] Int. Cl. .......... H03k 17/28
[50] Field of Search .......... 307/234, 266, 279, 293, 304; 328/111, 112, 120

[56] References Cited
UNITED STATES PATENTS

| | | | |
|---|---|---|---|
| 3,193,701 | 7/1965 | Lawhon | 307/293X |
| 3,284,782 | 11/1966 | Burns | 307/279X |
| 3,408,512 | 10/1968 | Raisanen | 307/293X |
| 3,522,454 | 8/1970 | Gilmour | 307/279X |

*Primary Examiner*—Donald D. Forrer
*Assistant Examiner*—R. C. Woodbridge
*Attorneys*—James K. Haskell and Paul M. Coble

ABSTRACT: A pulse spacing discriminator circuit may be formed on a single semiconductor substrate utilizing five MOS field effect transistors and a maximum of four field effect transistor switch resistors. The circuit provides an output pulse if the spacing between successive input pulses is greater than a predetermined time interval. The output pulse terminates upon receipt of the next input pulse.

INVENTOR.
CARROLL R. PERKINS,
BY
Paul M. Coble
ATTORNEY

PULSE SPACING DISCRIMINATOR CIRCUIT

This invention relates to electronic circuits, and more particularly relates to a pulse spacing discriminator for providing an output pulse if the spacing between successive input pulses is greater than a predetermined time interval.

Recent advances in microelectronics, including the development of MOS (metal-oxide-semiconductor) devices, have led to new approaches to the design and fabrication of various types of electronic circuits. Specifically, it is often desired to fabricate a complete integrated circuit or system on a single semiconductor substrate, as well as to be able to drive all of the circuit or system components with voltage levels provided by integrated circuit logic.

Accordingly, it is an object of the present invention to provide a pulse spacing discriminator circuit which is more compatible with integrated electronic circuitry than has been achieved in the prior art.

It is a further object of the present invention to provide a pulse spacing discriminator which can be formed entirely on a single semiconductor substrate, or even on only a small portion of such a substrate, and which discriminator is readily operable with voltage levels provided by integrated circuit logic.

It is a still further object of the invention to provide a pulse spacing discriminator circuit of extremely small size and weight, and which circuit is also relatively insensitive to wide temperature changes.

In accordance with the foregoing objects, a pulse spacing discriminator according to the invention includes five field effect transistors having their respective source electrodes connected together. The drain electrodes of the second and third transistors and of the fourth and fifth transistors are also connected together. The drain electrodes of the first transistor is coupled to the gate electrode of the second transistor, while the interconnected drain electrodes of the second and third transistors are coupled to the gate electrode of the fourth transistor. Input pulses are applied to the gate electrodes of the first and fifth transistors, while an output pulse is obtained from the circuit at the interconnected drain electrodes of the fourth and fifth transistors. A feedback signal from the fourth and fifth transistors. A feedback signal from the drain electrodes of the fourth and fifth transistors is applied to the gate electrode of the third transistor.

Figure 1:
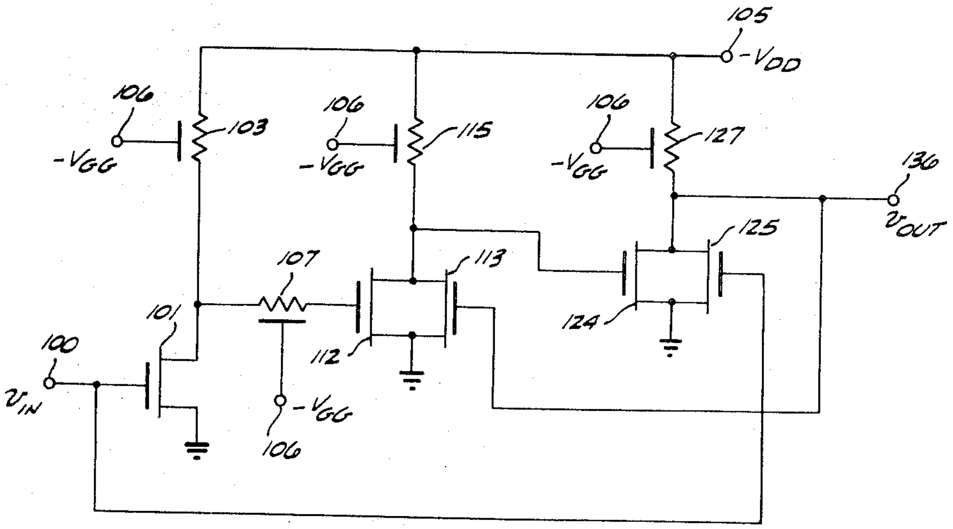
Figure 2:
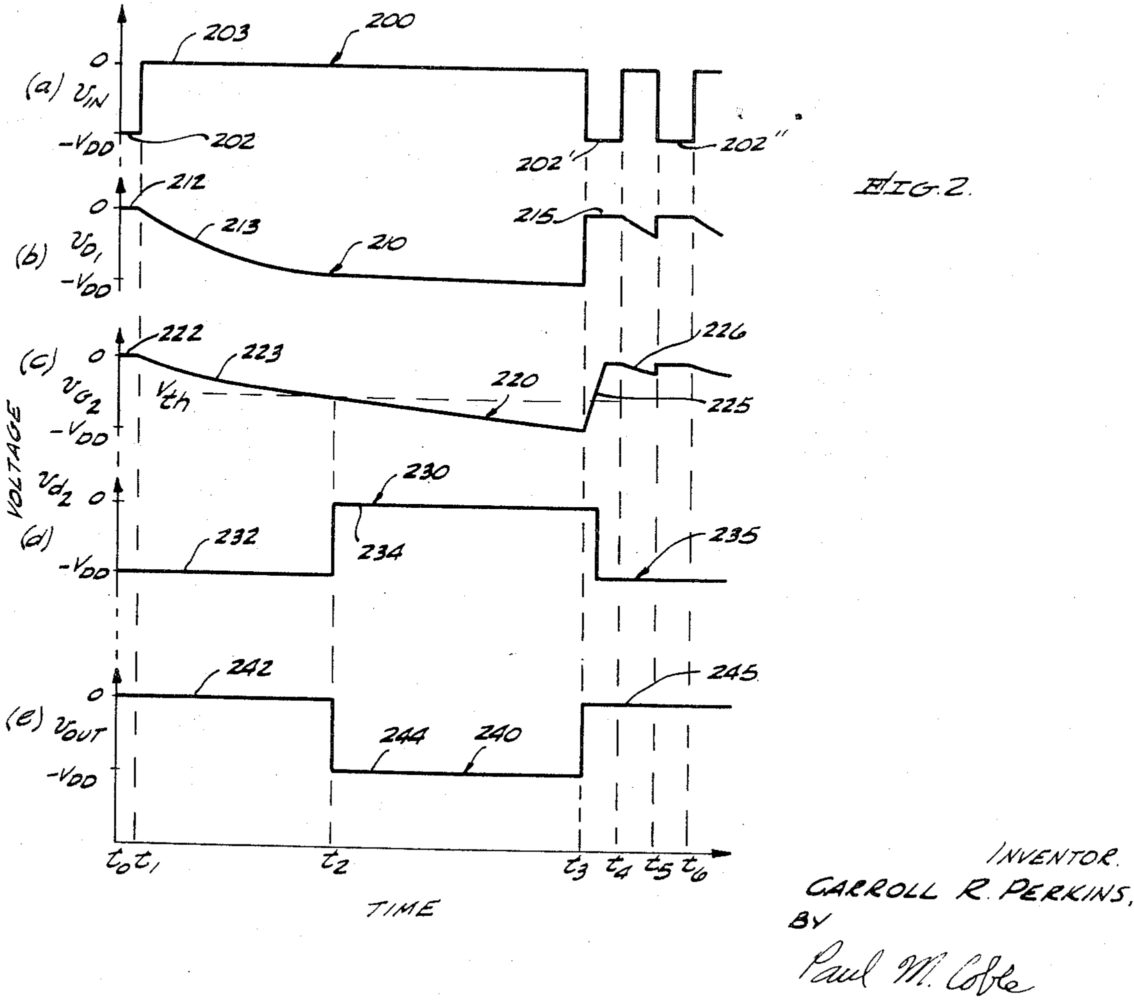

Additional objects, advantages, and characteristic features of the invention will be apparent from the following detailed description of a preferred embodiment of the invention when considered with the accompanying drawing in which:

FIG. 1 is a schematic circuit diagram illustrating a pulse spacing discriminator circuit according to the invention; and FIGS. 2 (*a*)—(*e*) show waveforms of the voltage at various points in the circuit of FIG. 1 as a function of time.

Referring to FIG. 1 with greater particularity, a pulse spacing discriminator according to the invention has an input terminal 100 for receiving input pulses, designated $v_{in}$. Terminal 100 is connected to the gate electrode of a first field effect transistor 101 which is preferably a metal-oxide-semiconductor field effect transistor (MOSFET). The source electrode of transistor 101 is connected to a level of reference potential, illustrated as ground, while the drain electrode of transistor 101 is coupled via a resistive device 103 to a power supply terminal 105 furnishing a voltage $-V_{DD}$, which may be −13 volts, for example.

Resistive device 103 is illustrated as a field effect transistor switch resistor. Such a resistor may be provided by appropriate biasing of a field effect transistor designed with a channel width-to-length ratio approximately an order of magnitude less than that of a field effect transistor such as 101. As shown in FIG. 1, the gate electrode of switch resistor 103 is connected to a power supply terminal 106 providing a voltage $-V_{GG}$, which may be −26 volts, for example. Such a gate voltage, in conjunction with the aforementioned exemplary value for the voltage $-V_{DD}$, will bias the source-drain path of switch resistor 103 to essentially a saturated conductive condition. When the switch resistor 103 is designed with the aforementioned channel width-to-length ratio, the resistor 103 will provide a resistance approximately an order of magnitude greater than that of the source-drain path of field effect transistor 101 when the transistor 101 is operated in an essentially saturated conductive condition.

The drain electrode of field effect transistor 101 may be coupled via a circuit sensitivity determining resistive device 107 to the gate electrode of a second field effect transistor 112 which may be similar to the transistor 101. The resistive device 107 is illustrated as a field effect transistor switch resistor similar to the switch resistor 103 and having its gate electrode connected to power supply terminal 106. The resistance of resistive device 107 determines the minimum input pulse spacing for which the circuit will provide an output pulse. This resistive device may be replaced with a direct connection when the desired minimum input pulse spacing is sufficiently short to allow the proper time delay to be provided by the resistance of resistive device 103 and the inherent drain-source capacitance of field effect transistor 101.

The source-drain path of the second field effect transistor 112 is connected in parallel with the source-drain path of a similar third field effect transistor 113. The interconnected source electrodes of the field effect transistors 112 and 113 are connected to ground, while the interconnected drain electrodes of these transistors are coupled to power supply terminal 105 via a resistive device 115. Resistive device 115 may be a field effect transistor switch resistor similar to switch resistor 103 and having its gate electrode connected to power supply terminal 106.

The drain electrodes of field effect transistors 112 and 113 are also connected to the gate electrode of a fourth field effect transistor 124 having its source-drain path connected in parallel with that of a fifth field effect transistor 125, the gate electrode of which is connected to input terminal 100. The transistors 124 and 125, which are similar to transistor 101, have their interconnected source electrodes connected to ground and their interconnected drain electrodes coupled to power supply terminal 105 via a resistive device 127. Resistive device 127 may be a field effect transistor switch resistor similar to switch resistor 103 and having its gate electrode connected to power supply terminal 106.

Output pulses $v_{out}$ from the circuit of FIG. 1 may be taken from output terminal 136 which is connected directly to the interconnected drain electrodes of transistors 124 and 125. A feedback signal is applied to the gate electrode of field effect transistor 113 by connecting output terminal 136 to this gate electrode. The entire circuit of FIG. 1 including each of the field effect transistors, each of the field effect transistor switch resistors, and the interconnecting circuitry may be fabricated on a single semiconductor substrate.

The operation of the circuit of FIG. 1 will now be described with reference to the waveforms of FIG. 2. An exemplary sequence of input pulses $v_{in}$ is illustrated by the waveform 200 of FIG. 2(*a*). For purposes of discussion, the absence of a pulse is represented by a voltage level of zero volts, while the presence of a pulse is represented by a voltage at a level 202 essentially equal to $-V_{DD}$.

At time $t_0$ it is assumed that input pulse 202 is present at input terminal 100. Field effect transistor 101 is thus biased to a conductive condition, and the potential $v_{D_1}$ at its drain electrode resides at essentially zero volts as shown by portion 212 of waveform 210 of FIG. 2(*b*). The voltage $v_{G_2}$ at the gate electrode of field effect transistor 112 also resides at essentially zero volts as illustrated by portion 222 of waveform 220 of FIG. 2(*c*). The field effect transistor 112 is thus biased to a cutoff condition, causing the potential $v_{D_2}$ at its drain electrode to reside at essentially $-V_{DD}$, as shown by portion 232 of waveform 230 of FIG. 2(*d*). Since the voltage $v_{D_2}$ is applied to the gate electrode of field effect transistor 124, transistor 124 is biased to a conductive condition, and the output voltage $v_{out}$ resides at essentially zero volts as shown by portion 242 of waveform 240 of FIG. 2(*e*). At this time field effect transistor 125 is biased to a conductive condition by the negative input pulses 202 applied to its gate electrode, and transistor 113 is biased to a cutoff condition by the zero-volt output voltage at terminal 136.

At time $t_1$ input pulse 202 terminates, and the waveform 200 returns to essentially zero volts as shown at 203. Field effect transistor 101 is thereby cut off, and the voltage $v_{D_1}$ at its drain electrode begins a decay toward $-V_{DD}$ along portion 213 of waveform 210 of FIG. 2(*b*). The time constant of this voltage decay is determined primarily by the resistance of resistive device 103 and the inherent drain-source capacitance of field effect transistor 101. The voltage $v_{G_2}$ at the gate electrode of transistor 112 generally follows the voltage $v_{D_1}$ as indicated by portion 223 of waveform 220 of FIG. 2(*c*). However, the time constant for the decay of the voltage $v_{G_2}$ is longer than that for the voltage $v_{D_1}$ because of the additional resistance provided by resistive device 107 and the inherent gate input capacitance of transistor 112. Although the termination of input pulse 202 also results in cutting off field effect transistor 125, the output voltage $v_{out}$ is unaffected at this time because transistor 124 remains conductive.

When the voltage $v_{G_2}$ at the gate electrode of field effect transistor 112 has reached the threshold level $V_{th}$ for the transistor 112, which occurs at time $t_2$, the transistor 112 is biased into conduction, and the voltage $v_{D_2}$ at its drain electrode becomes essentially zero volts as shown by portion 234 of waveform 230 of FIG. 2(*d*). It is pointed out that the time required for the voltage $v_{G_2}$ to decay from zero to the threshold level $V_{th}$ is made equal to the minimum time interval during which the absence of an input pulse will enable the generation of an output pulse. As shown in FIG. 2, this time interval may be 2½ to 3 times the normal pulse period for the input pulses 202, for example.

When the drain voltage $v_{D_2}$ becomes zero, field effect transistor 124 is cut off. Since field effect transistor 125 is also in a cutoff state, output voltage $v_{out}$ drips to essentially $-V_{DD}$ as shown by portion 244 of waveform 240 of FIG. 2(*e*), thereby providing an output pulse at terminal 136. Since the voltage at terminal 136 is fed back to the gate electrode of transistor 113, transistor 113 now becomes conductive. The voltage at output terminal 136 remains at the level 244 of FIG. 2(*3*) until the circuit receives the next input pulse.

When the next input pulse 202′ of FIG. 2(*a*) is applied to input terminal 100 at time $t_3$, field effect transistor 101 is rendered conductive, thereby returning the potential at its drain electrode to zero volts as shown by waveform portion 215 of FIG. 2(*b*). The input pulse 202′ also renders field effect transistor 125 conductive, returning the voltage at its drain electrode to zero volts as shown by waveform portion 245 of FIG. 2(*e*), thus terminating output pulse 244 and cutting off transistor 113. The voltage $v_{G_2}$ at the gate electrode of transistor 112 returns toward zero volts along waveform portion 225 of FIG. 2(*c*). When the voltage $v_{G_2}$ reaches the threshold level $V_{th}$ the transistor 112 becomes cut returning the voltage $v_{D_2}$ at its drain electrode to $-V_{DD}$ as shown by waveform portion 235 of FIG. 2(*d*), and thereby biasing transistor 124 into conduction.

At time $t_4$ the second input pulse 202′ terminates, and the circuit returns to the same operative condition as existed upon the termination of the first input pulse 202. The voltage $v_{G_2}$ begins to decay toward the threshold level $V_{th}$ as shown by waveform portion 226 of FIG. 2(*c*). However, since the next input pulse 202″ is received at time $t_5$, which occurs before the voltage $v_{G_2}$ is able to decay to the threshold level $V_{th}$, the circuit is returned to the same operative condition as existed when the pulse 202′ was received. This insures that after termination of pulse 202″ at time $t_6$ the output voltage $v_{out}$ will remain at zero volts (i.e. no additional output pulse 244 will be generated) for at least the time interval required for the voltage $v_{G_2}$ to decay from zero to the threshold level $V_{th}$. If no further input pulses are received during this time interval, the next output pulse will commence at the end of the time interval and will terminate upon receipt of the next input pulse. On the other hand, if an input pulse is received before the end of the time interval, the time interval will start anew upon the termination of this input pulse.

Although the present invention has been shown and described with reference to a particular embodiment, nevertheless various changes and modifications obvious to a person skilled in the art to which the invention pertains are deemed to lie within the purview of the invention.

What I claim is:

1. A pulse spacing discriminator circuit comprising: first, second, third, fourth and fifth field effect transistors each having a first electrode, a second electrode and a control electrode; the respective first electrodes of each of said transistors being connected together; the respective second electrodes of said second and third transistors being connected together; the respective second electrodes of said fourth and fifth transistors being connected together; the second electrode of said first transistor being coupled to the control electrode of said second transistor; the interconnected second electrodes of said second and third transistors being coupled to the control electrode of said fourth transistor; means for applying input pulses to the control electrode of said first transistor and to the control electrode of said fifth transistor; means coupled between the first and second electrodes of each of said transistors for furnishing operating potentials for said transistors; means for obtaining an output signal at the interconnected second electrodes of said fourth and fifth transistors; and means for applying a feedback signal from said interconnected second electrodes of said fourth and fifth transistors to the control electrode of said third transistor.

2. A pulse spacing discriminator circuit according to claim 1 wherein said means for furnishing operating potentials comprises: a source of potential having a first terminal and a second terminal, said first terminal being connected to the first electrodes of each of said transistors, a first resistive device coupled between said second terminal and the second electrode of said first transistor, a second resistive device coupled between said second terminal and the interconnected second electrodes of said second and third transistors, and a third resistive device coupled between said second terminal and the interconnected second electrodes of said fourth and fifth transistors. .

3. A pulse spacing discriminator circuit according to claim 2 wherein each said resistive device is a field effect transistor switch resistor.

4. A pulse spacing discriminator circuit according to claim 3 wherein each said field effect transistor switch resistor has a channel width-to-length ratio approximately an order of magnitude less than that of said first, second, third, fourth and fifth field effect transistors.

5. A pulse spacing discriminator circuit according to claim 4 wherein each said field effect transistor switch resistor is biased to essentially a saturated conductive condition.

6. A pulse spacing discriminator circuit according to claim 1 wherein a field effect transistor switch resistor is coupled between the second electrode of said first transistor and the control electrode of said second transistor.

7. A pulse spacing discriminator circuit according to claim 6 wherein said field effect transistor switch resistor has a channel width-to-length ratio approximately an order of magnitude less than that of said first, second, third, fourth and fifth field effect transistors.

PO-1050
(5/69)

UNITED STATES PATENT OFFICE
CERTIFICATE OF CORRECTION

Patent No. 3,582,677 Dated June 1, 1971

Inventor(s) Carroll R. Perkins

It is certified that error appears in the above-identified patent and that said Letters Patent are hereby corrected as shown below:

Column 1, lines 42-43, delete "A feedback signal from the fourth and fifth transistors.".
Column 3, line 37, "drips" should be --drops--;
42, "FIG. 2(3)" should be --FIG. 2(e)--;
55, after "cut" insert --off--.

Signed and sealed this 26th day of October 1971.

(SEAL)
Attest:

EDWARD M.FLETCHER,JR.
Attesting Officer

ROBERT GOTTSCHALK
Acting Commissioner of Patents